United States Patent
Wohlfarth

(10) Patent No.: US 6,288,560 B1
(45) Date of Patent: Sep. 11, 2001

(54) SELF-SOLDERING INTEGRATED CIRCUIT PROBE ASSEMBLY

(75) Inventor: Paul D. Wohlfarth, Vernonia, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/364,683

(22) Filed: Jul. 30, 1999

(51) Int. Cl.[7] .................................................. G01R 31/02
(52) U.S. Cl. .................................................. 324/758
(58) Field of Search .................................. 324/758, 757, 324/158.1, 760, 754; 257/697, 700, 724; 438/107, 106, 445

(56) References Cited

U.S. PATENT DOCUMENTS

| | | |
|---|---|---|
| 4,055,800 | 10/1977 | Fisk et al. . |
| 4,362,991 | 12/1982 | Carbine . |
| 4,561,006 * | 12/1985 | Currie ..................................... 357/28 |
| 4,767,985 | 8/1988 | Shearer, Jr. et al. . |
| 6,094,059 * | 7/2000 | Frankeny et al. ..................... 324/757 |

* cited by examiner

Primary Examiner—Safet Metjahic
Assistant Examiner—E LeRoux
(74) Attorney, Agent, or Firm—Daniel J. Bedell; Smith-Hill and Bedell

(57) ABSTRACT

A probe assembly for probing pins of an integrated circuit (IC) includes a base providing a set of solder-coated contacts arranged to contact a corresponding set of IC pins when the base is placed over the IC pins. The base also includes an heating element for briefly delivering heat to the contacts so that when the base is placed over the IC with the contacts in resting on the IC pins, the heat provided by heating element temporarily melts the solder coating on the contacts. Thereafter, the solder cools and solidifies to form a firm bond between the contacts to the IC pins. The heating element suitably comprises material that generates substantial heat in response to a voltage pulse applied across the heating element or alternatively may act as a heat conductor for conducting heat from an external heat source to the contacts.

26 Claims, 4 Drawing Sheets

SELF-SOLDERING INTEGRATED CIRCUIT PROBE ASSEMBLY

CROSS-REFERENCE TO RELATED APPLICATION

Figure 1:
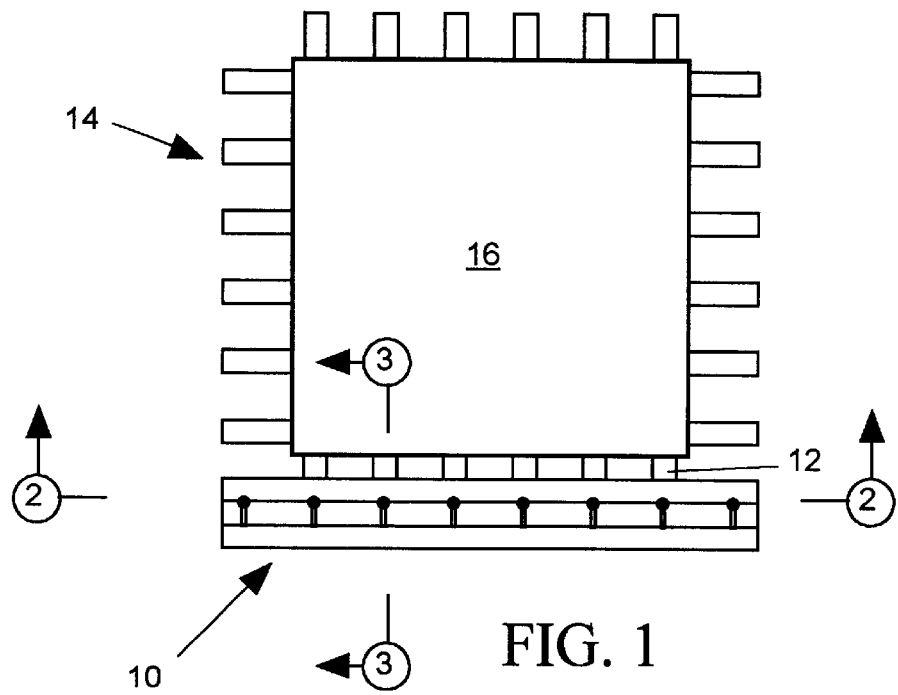

The present application contains subject matter relating to the subject matter of copending U.S. Patent Application Ser. No. 09/364,682 filed concurrently herewith.

BACKGROUND OF THE INVENTION

1. Field of the Invention

The present invention relates in general to integrated circuit (IC) probes and in particular to a self-soldering probe assembly that attaches a set of probes to input/output pins of a flat pack IC package.

2. Description of Related Art

When testing a circuit implemented by integrated circuits (ICs) mounted on a circuit board, a technician can access a circuit node by manually holding a probe to a pin of an IC. However it is difficult for a technician to concurrently access more than one or two IC pins using this method. It is also often difficult to access pins of an IC mounted on a circuit board when the circuit board is in its normal operating environment. For example when the circuit board is installed in a backplane next to another circuit board there can be very little clearance between the circuit boards for accommodating a probe. Thus it would be beneficial to provide a probe that can be firmly connected to an IC mounted on a circuit board, that would remain attached when the circuit board is thereafter installed in its normal operating environment, and which has a low profile so that it requires very little space above the IC.

Probes have been developed which clamp to IC pins. For example U.S. Pat. No. 4,767,985 issued Aug. 30, 1988 to Shearer, Jr. et al describes a probe that clamps to the corner pins of an IC package. Such a probe is suitable for packages having pins that can be easily gripped by a probe. However flat pack IC packages having pins that are soldered flush with the circuit board would be difficult for such a probe to firmly grip. Also the described probe assembly is relatively tall and would not be useful where space above the IC is limited.

U.S. Pat. No. 4,362,991 issued Dec. 7, 1982 to Carbine describes a probe assembly for flat pack IC packages employing an external frame to hold a probe onto flat pack pins by pressure. However the assembly is large and inconvenient to use insofar as the circuit board has to be mounted within the probe assembly rather than installed in its normal operating environment.

U.S. Pat. No. 4,055,800 issued Oct. 25, 1977 to Fisk et al. describes a probe that clamps to the body of an IC rather than to its pins. While this type of probe can grasp relatively thick integrated circuit packages, a flat pack package is typically so thin that it would be difficult for such a probe to firmly grip its body. Also since the probe is held to an IC package body only by lateral pressure, it can easily fall off. This probe assembly is also relatively tall and therefore not practical where space above the IC is limited.

What is needed is a probe assembly for easily and firmly holding a set of probes onto pins of a flat pack or other type of integrated circuit package mounted on a circuit board and which has a relatively low profile so that it does not require substantial space above the circuit board.

It would also be desirable to provide a low profile probe assembly that can access a large number of IC pins. However such a probe assembly would require a large number conductors to convey signals between the probe assembly and external test equipment requiring access to the IC pins. It would therefore also be helpful if the probe assembly itself could carry out some of the functions of the external test equipment so as to reduce the number of connections between the probe assembly and the external test equipment.

It would be of further benefit for a probe assembly to provide a relatively short signal path between an IC pin and high impedance buffer amplifier. Prior art probes typically include high-impedance buffer amplifiers in the signal path between an IC pin and test equipment accessing the pin in order to reduce the load the probe presents at the pin. However, since prior art probe assemblies provide a relatively long signal path between an IC pin and buffer amplifier, the capacitance and inductance of those signal paths act as a load on the IC pin. By providing a very short path between buffer amplifiers and the IC pins, an improved probe assembly would reduce the load on the IC pins.

SUMMARY OF THE INVENTION

A probe assembly in accordance with the invention provides signal paths between test equipment and pins of an integrated circuit (IC) package having a body with a set of pins extending horizontally outward from the body and soldered to pads on the surface of a circuit board.

In accordance with one aspect of the invention, the probe assembly includes a base providing a set of solder-coated contacts arranged to contact a corresponding set of IC pins when the base is placed over the IC pins. The base also includes a heating element for temporarily delivering heat to the contacts. When the base is placed over the IC with the contacts in resting on the IC pins, the heat provided by heating element temporarily melts the solder coating on the contacts. Thereafter, when the heating element stops delivering heat to the contacts, the solder cools and solidifies to form a firm bond between the contacts and the IC pins. To subsequently remove the probe assembly from the IC, the heating element again temporarily delivers heat to the contacts, thereby melting the solder holding the contacts onto the pins so that the probe assembly can then be easily lifted off the IC pins.

In accordance with another aspect of the invention, the heating element suitably comprises material that generates the heat needed to melt the solder in response to a pulse of current. Thus the probe assembly can be removed from the IC after supplying a current pulse through the heating element. The heating element may alternatively conduct heat from an external heat source (such as for example a soldering iron) to the contacts.

In accordance with a further aspect of the invention, the probe assembly also includes a set of guide fingers formed of resilient insulating material extending downward from the base. The guide fingers fit between separate pairs of the IC pins when the base is placed over the IC package body to act as guides for positioning the contacts on the IC pins.

In accordance with another aspect of the invention, the probe assembly base includes a printed circuit board upon which are mounted high-impedance amplifiers for buffering signals passing between the IC pins and external test equipment accessing those pins. Since the signal paths between the pins and the buffer amplifiers are short, the probe assembly presents very little load on the IC pins. An intelligent interface circuit may also be installed on the printed circuit board for carrying out test activities on the IC and for reducing the number of connections needed between the probe assembly and the external test equipment.

It is accordingly an object of the invention to provide a probe assembly that is easily and firmly attached to a flat pack or other type of integrated circuit package and thereafter easily removed, that low occupies little vertical space above the IC package, that presents a minimal load at the IC pins, and that minimizes the number of signal paths needed between the probe assembly and external test equipment.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS(S)

Figure 2:
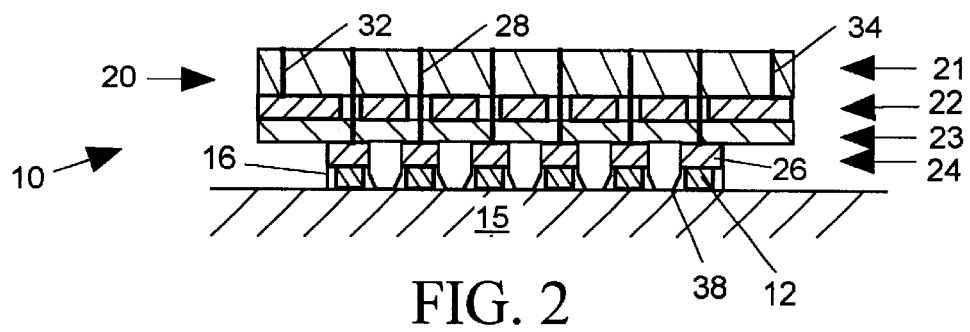
Figure 3:
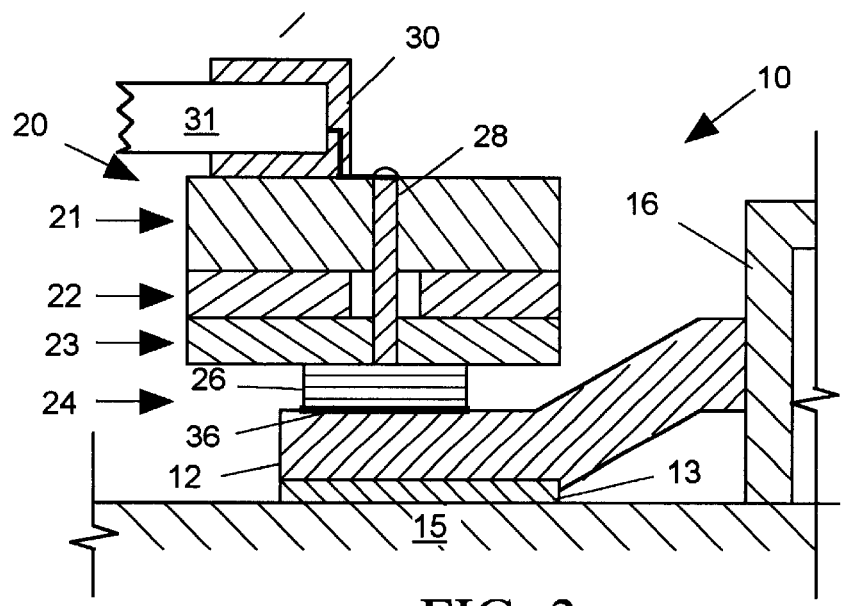
Figure 4:
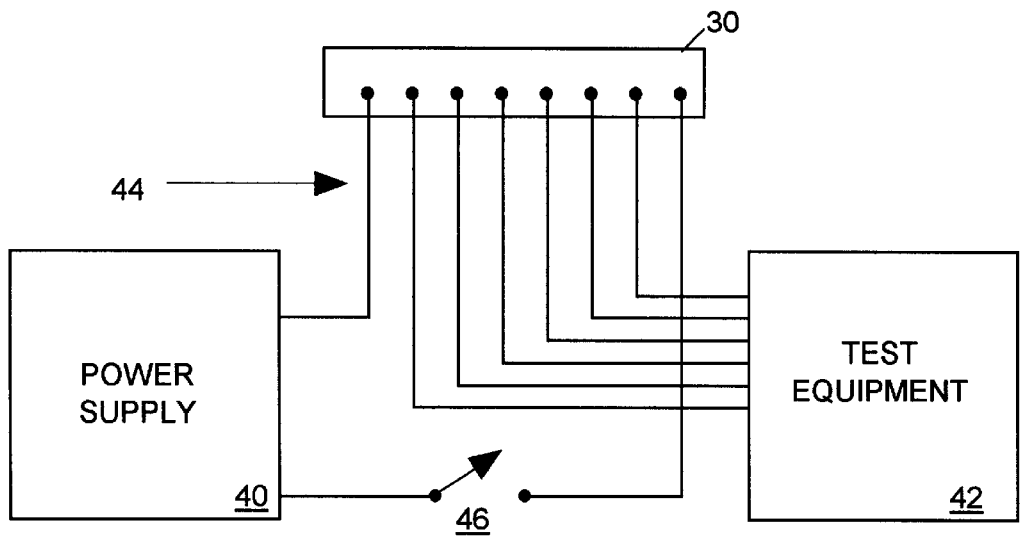
Figure 5:
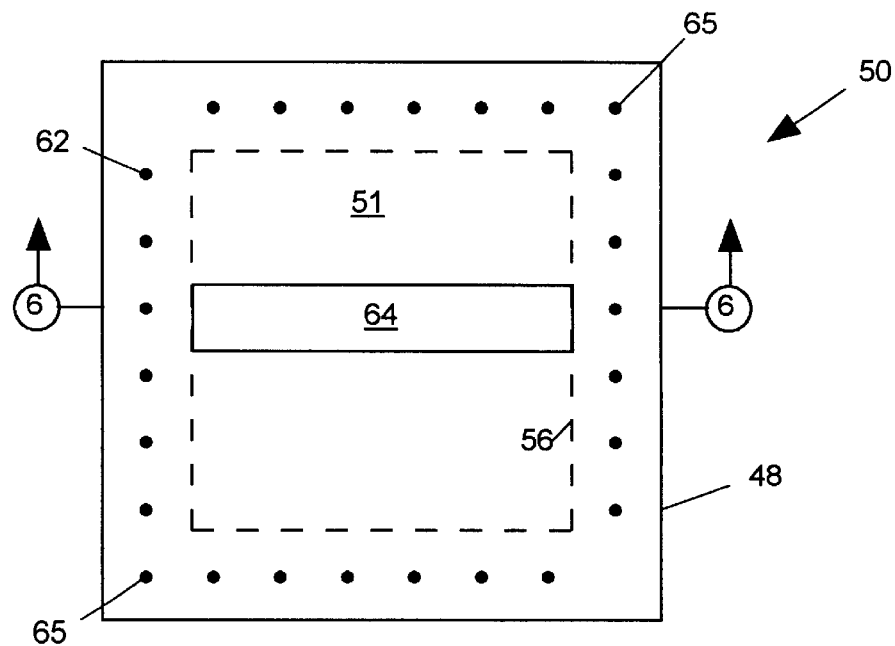
Figure 6:
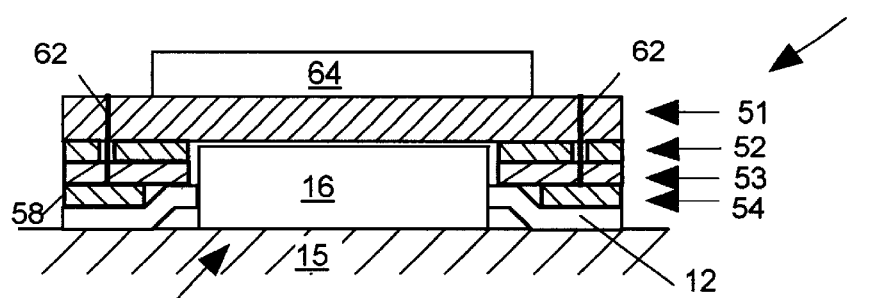
Figure 7:
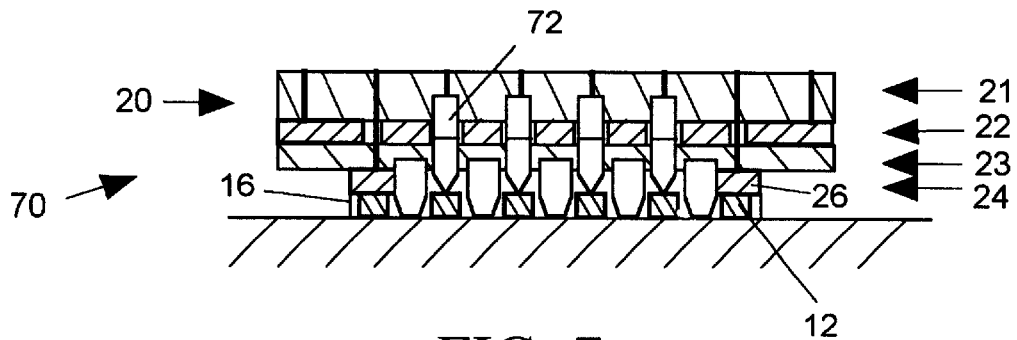
Figure 8:
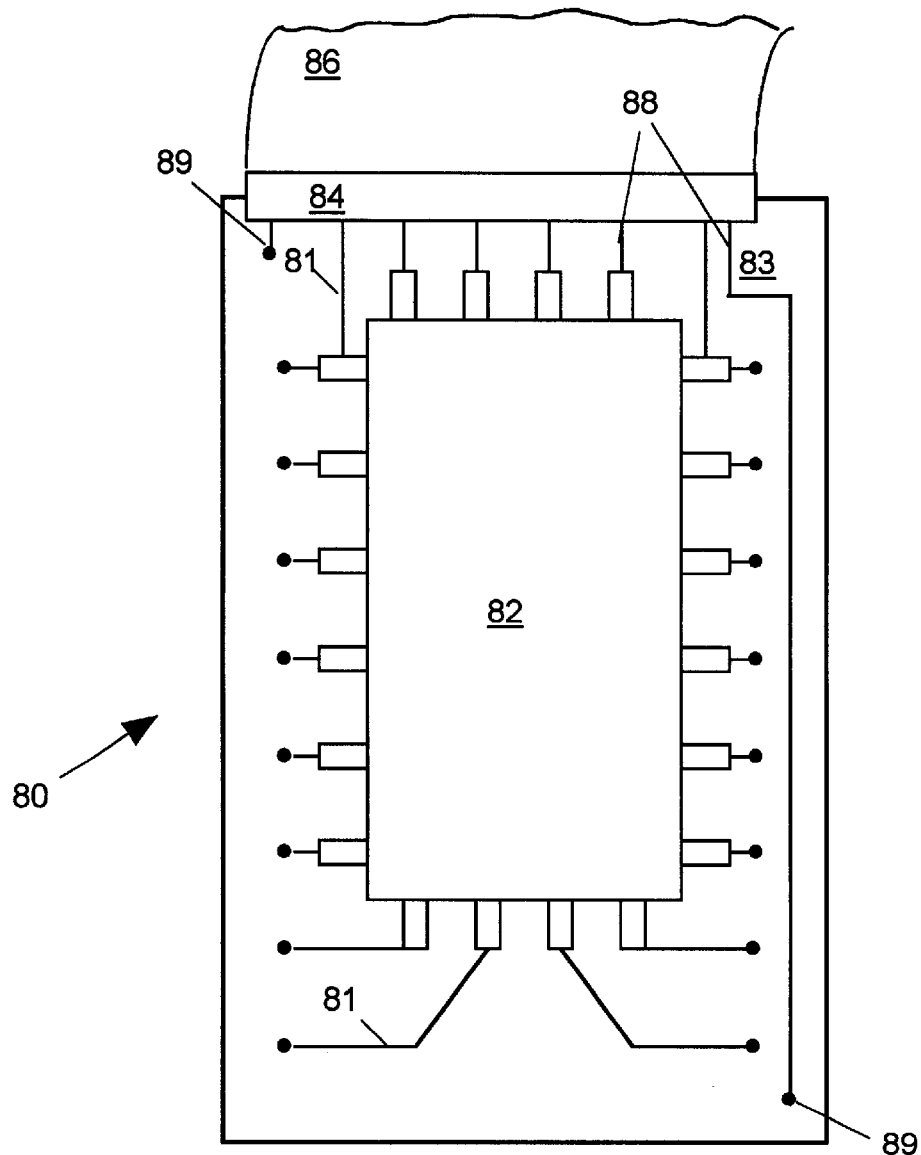
Figure 9:
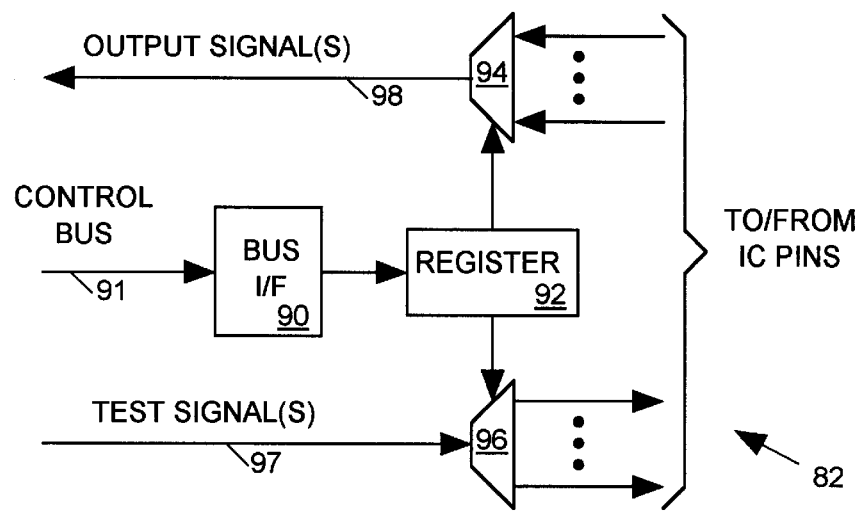
Figure 10:
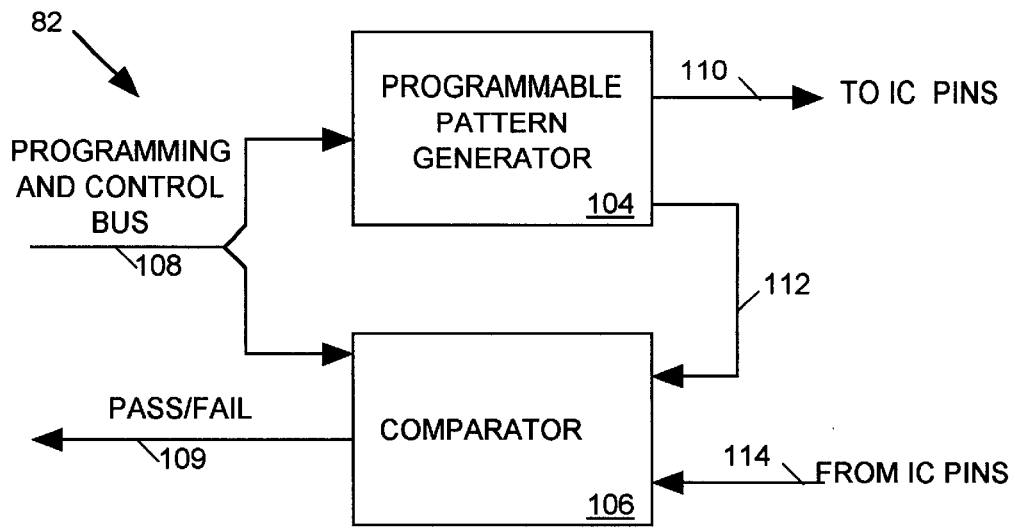
Figure 11:
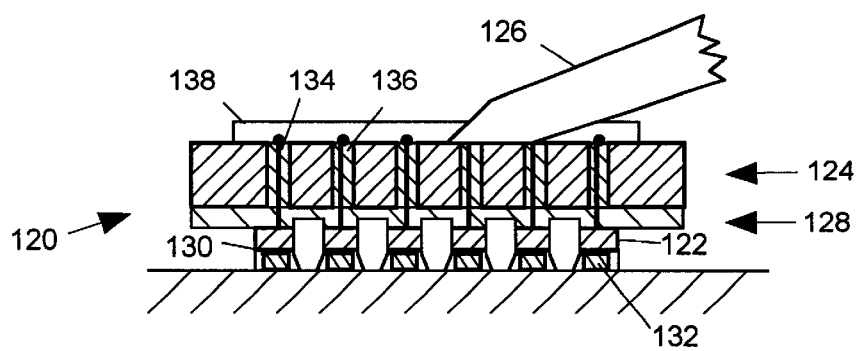

FIG. 1 is a plan view of a probe assembly in accordance with the present invention, FIG. 2 is a sectional elevation view of the probe assembly of FIG. 1, FIG. 3 is a side elevation view of the probe assembly of FIG. 1, FIG. 4 is an electrical block diagram of the probe assembly of FIG. 1, FIG. 5 is a plan view of a first alternative embodiment of a probe assembly in accordance with the present invention, FIG. 6 is a sectional elevation view of the probe assembly of FIG. 5, FIG. 7 is a sectional elevation view of a second alternative embodiment of a probe assembly in accordance with the invention, FIG. 8 is a plan view of a third embodiment of a probe assembly in accordance with the present invention, FIGS. 9 and 10 are block diagrams of circuits alternatively implemented by the integrated circuit included in the probe assembly of FIG. 8, and FIG 11 is a sectional elevation view of a fourth alternative embodiment of a probe assembly in accordance with the invention.

DESCRIPTION OF THE PREFERRED EMBODIMENTS(S)

FIGS. 1–3 illustrate a probe assembly 10 in accordance with the invention for providing external test equipment with input/output signal access to a row of pins 12 of an integrated circuit (IC) package 14 soldered to pads 13 on the surface of a circuit board 15. Integrated circuit package 14 may be a conventional quad flat pack package as illustrated in FIG. 1 or may be any other type of IC package having a body 16 and at least one row of input/output pins 12 extending horizontally outward from body 16.

Probe assembly 10 includes a set of probes for providing signal paths for test equipment accessing pins 12. As described below, probe assembly 10 is designed so that it can be easily and firmly soldered in place over the IC package 14 and then easily removed. Probe assembly 10 is also designed to provide a relatively low vertical profile so that it can be used to access the pins of IC package 14 when relatively little space is available above the IC package 14. This makes probe assembly 10 particularly useful when accessing an IC mounted on a circuit board and operating within it normal working environment such as installed in a backplane connector close to another circuit board or in an equipment chassis with little clearance above the circuit board.

Probe assembly 10 includes a base 20 including an electrically conductive heating element 22 sandwiched between upper and lower electrical insulating layers 21 and 23. A conductive contact layer 24 of copper or another metallic conductor on the lower surface of lower insulating layer 23 is etched to form a set of contacts 26 spaced to align with the row of IC pins 12. A set of vias 28 link contacts 26 to a ribbon cable connector 30 mounted on top of base 20. A ribbon cable 31 connected to connector 30 routes signals to or from external test equipment.

Heating layer 22 is suitably made of copper nichrome, brass or other relatively high resistance conductor that generates heat when conducting a current. A pair of vias 32 and 34 link pins of connector 30 to opposing sides of heating element 22 so that an external power supply can selectively apply a voltage across heating element 22 via connector 30. When contacts 26 are manually held in position upon pins 12, the external power supply applies a voltage pulse across heating element 22 thereby producing a current through heating element 22 and causing it generate heat. A small layer of solder 36 is deposited on the lower surface of contacts 26, and the heat generated by heating element 22 travels downward though lower insulating layer 23 and contacts 24 to melt solder 36. When the voltage pulse terminates, heating element 22 stops generating heat. Solder 36 then quickly cools and solidifies, thereby firmly bonding contacts 26 to pins 12. When probe assembly 10 is to be removed from contacts 12, the external power supply sends another voltage pulse to heating element 22 to once again cause the heating element to generate enough heat to melt solder 36 thereby allowing probe assembly 10 to be easily lifted off pins 12.

Upper insulating layer 21, suitably a conventional circuit board, provides rigidity to base 20. Lower insulating layer 23 is made thin and suitably constructed of glass epoxy or ceramic (or other electrically insulating material that is a good heat conductor) and withstands high temperatures to provide good electrical isolation between heating element 22 and contacts 26 while providing relatively low thermal resistivity. Thus layer 23 electrically isolates but thermally links contacts 26 and heating element 24.

Probe assembly 10 also includes a set of guide fingers 38 formed of insulating material attached to base 20 with each finger 38 extending downward to fit between an adjacent pair of IC pins 12. Guide fingers 38, which guide probe assembly 10 into place over pins 12, extend somewhat lower than contacts 26 so that they properly position probes 38 over pins 12 as contacts 26 are pressed onto IC pins 12. Guide fingers 46 are suitably made of resilient material such as General Electric Model "ATV" adhesive screened on layer 23 so that they can be compressed firmly against the upper surface of the circuit board 15 upon which IC 14 is mounted without damaging it.

Thus to install probe assembly 10 on pins 12 it is necessary only to position it in place over pins 12 and place a voltage signal pulse across heating element 22 of sufficient duration and magnitude to melt solder 36 and to continue to hold probe assembly in place until solder 36 solidifies. The voltage pulse can be repeated to melt solder 36 again so that probe assembly 10 can be easily removed from pins 12.

FIG. 4 is an electrical block diagram illustrating the manner in which a power supply 40 and test equipment 42 are connected to connector 30 of probe assembly 10 of FIGS. 1–3 via a ribbon cable 44. Power supply 40 supplies the voltage that produces a current through heating element 22 of FIGS. 2 and 3. A switch 46 is inserted in one of output leads of power supply 40. When switch 46 is closed, power supply 40 supplies current through heating element 22.

FIGS. 5 and 6 illustrates another embodiment of a probe assembly 50 in accordance with the invention capable of contacting pins 12 distributed on all four sides of IC 14 of FIG. 1. Probe assembly 50 includes a rectangular base 48 having a set of layers 51–54 similar to layers 21–24 of probe assembly 10 of FIG. 1. However base 48 is large enough to fully cover IC 14 and has an aperture 56 in layers 52-54 sized for receiving the body 16 of IC 14. Contacts 58 formed by contact layer 54 are distributed around the periphery of aperture 56 to align with IC pins 12 when probe assembly 50 is placed over IC body 16. Guide fingers (not shown in FIGS. 5 and 6) similar to guide fingers 38 of FIG. 2 may be provided to aid alignment of contacts 58 on pins 12. However, when aperture 58 is sized to fit snugly over body 16, the guide fingers may be omitted since aperture 58 acts as a suitable alignment guide. The upper layer 51 of base 48 is suitably a printed circuit board. A set of vias 62 link each contact 58 to the upper surface of layer 51 and a set of circuit traces formed on the surface of layer 51 link vias 62 to a ribbon cable connector 64 mounted on base 60. Vias 65 near opposing corners of base 48 link the heating element 52 to other traces (not shown) on the surface of layer 51 also leading to connector 64.

FIG. 7 illustrates a probe assembly 70 in accordance with the present invention generally similar to probe assembly 10 of FIG. 2 except that all but the outermost contacts 26 of probe assembly 10 have been replaced in probe assembly 70 with a set of spring pins 72 (also known as "pogo pins") acting as probes for contacting IC pins 12. Thus probe assembly 70 is held in place by contacts 26 soldered only to the outermost pins of the row of pins 12. Spring pins or other kinds of probes attached to base 48 may also be substituted for a portion of contacts 58 of probe assembly 50 of FIG. 6 in a similar manner.

FIG. 8 illustrates another embodiment of the invention, a probe assembly 80 generally similar to probe assembly 50 of FIG. 5 but in which an integrated circuit 82 is mounted on circuit board 83 forming the top layer of probe assembly 80. A connector 84 for an external ribbon cable 86 leading to external test equipment and an external power supply is also installed on circuit board 83. Traces 88 link connector 84 to other pins of integrated circuit 82 and to vias 89 leading to the heating element within probe assembly 80. The integrated circuit 82 mounted on circuit board 63 suitably provides a high-impedance buffer between the IC being probed and the external test equipment.

Since the signal paths between buffers in IC 82 and pins 12 of the IC 14 being probed are very short, the signals have little capacitance and inductance. Thus probe assembly 80 places little load on the IC pins 12. In addition to providing high-impedance buffers, integrated circuit 82 may also include circuits providing an intelligent interface between the IC pins and external test equipment. Examples of such interface circuits are described below.

FIG. 9 is a block diagram illustrating an embodiment of IC 82 of FIG. 8 including a conventional bus interface 90 allowing external test equipment to use a serial control bus 91 (included in ribbon cable 86, FIG. 8) to write data to a register 92 controlling a pair of multiplexers 94 and 96. Multiplexer 94 selects one (or more) signal outputs of the IC being probed to be delivered to the test equipment via lines on ribbon cable 86. Multiplexer 96 applies a test signal (or signals) 97 arriving by ribbon cable 86 to one (or more) selected pins of the IC being probed. Thus IC 82 of FIG. 8 reduces the amount of cabling needed to link the probe assembly to test equipment not requiring concurrent access to all pins of the IC being probed.

FIG. 10 is a block diagram illustrating another embodiment of IC 82 of FIG. 8 wherein IC 82 carries out logic test functions. In this embodiment IC 82 implements a conventional programmable pattern generator 104 and a conventional comparator 106. Pattern generator 104 supplies one data pattern 110 as input signals to various pins of the IC being probed and another data pattern to comparator 106. Comparator 106 compares pattern 112 to an output signal pattern 114 appearing at other pins of the IC being probed to determine whether the IC is behaving as expected and sends a pass/fail signal 109 back to the external test equipment to indicate when the IC being probed has failed to produce an expected output data pattern. A programming and control bus 108 from external test equipment allows the external test equipment to program the patterns into pattern generator 104 and to control timing of its pattern generation as well as the timing of comparisons made by comparator 106.

FIG. 11 illustrates a probe assembly 120 in accordance with another embodiment of the invention in which the heat needed to melt solder on the probe's contacts 122 is not generated by heating element 124 but is instead supplied by the tip 126 of a soldering gun or other external heat source. Heating element 124, suitably comprising copper or other material having good thermal conductivity, transfers the heat to the probe contacts 122 via a thin insulation layer 128 thereby melting solder 130 on the lower surfaces of contacts 122. When soldering gun tip 126 is removed from heating element 124, solder 130 cools, solidifies and bonds contacts 122 to pins 132 of an IC. Vias 134 insulated from heating element 124 by insulating material 136 link contacts 122 to a cable connector 138 mounted on top of heating element 124.

Thus has been shown and described a low profile, high impedance probe assembly that can access a large number of pins of an IC.

While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A probe assembly for providing signal paths between pins of an integrated circuit (IC) package and external equipment, the probe assembly comprising:

a base comprising a heating element;

a plurality of probe contacts, each probe contact corresponding to a separate one of said pins, each probe contact being mounted on said base and being positioned to contact its corresponding pin; and solder attached to each of said probe contacts, wherein said heating element delivers sufficient heat for a period of time to said solder via said base and said probe contacts to warm and melt said solder, and wherein after said period of time said heating element stops delivering heat to said solder via said base and said probe contacts thereby allowing said solder to cool, solidify and bond each of said probe contacts to its corresponding pin.

2. The probe assembly in accordance with claim 1 wherein said heating element generates said heat.

3. The probe assembly in accordance with claim 2 wherein said heating element generates said heat in response to a voltage pulse applied thereto.

4. The probe assembly in accordance with claim 1 further comprising a heat source in contact with said heating element for supplying said heat to said heating element.

5. The probe assembly in accordance with claim 1 wherein said base further comprises:
   a first insulating layer for electrically insulating said heating element from said probe contacts; and
   a plurality of conductors, each conductor extending through said first insulating layer and said heating element from a separate one of said probe contacts.

6. The probe assembly in accordance with claim 5 wherein said base further comprises a second insulating layer, said heating element residing between said first insulating layer and said second insulating layer, said conductors also extending though said second insulating layer.

7. The probe assembly in accordance with claim 6 further comprising:
   a cable connector mounted on said second insulating layer, and
   means for conductively linking said conductors to said cable connector.

8. The probe assembly in accordance with claim 7 wherein said second insulating layer is a circuit board and wherein said means for conductively linking said conductors to said cable connector comprise conductive traces formed on said circuit board.

9. The probe assembly in accordance with claim 5 wherein said base further comprises a circuit board, said heating element residing between said first insulating layer and said circuit board, said conductors also extending though said circuit board.

10. The probe assembly in accordance with claim 9 further comprising:
    an integrated circuit device mounted on said circuit board, and
    a plurality of traces formed on said circuit board, each for conductively linking a corresponding one of said conductors to said integrated circuit device.

11. The probe assembly in accordance with claim 10 further comprising:
    a cable; and
    means for linking said cable to said integrated circuit device,
       wherein said integrated circuit device receives signals from said pins via said traces and conductors,
       wherein said integrated circuit device selects one of said signals received from said pins in response to a control signal conveyed on said cable, and
       wherein said integrated circuit device forwards the selected one of said signals outward on said cable.

12. The probe assembly in accordance with claim 10 further comprising:
    a cable; and
    means for connecting said cable to said integrated circuit device,
       wherein said integrated circuit device comprises amplifiers for buffering signals passing between said pins and said cable.

13. The probe assembly in accordance with claim 10 wherein said integrated circuit device generates a first signal pattern and a second signal pattern;
    wherein said integrated circuit device transmits said first signal pattern to some of said pins via said traces and conductors; and
    wherein said integrated circuit device receives a third signal pattern from others of said pins via said traces and conductors and compares them to said second signal pattern.

14. The probe assembly in accordance with claim 1 further comprising a guide finger attached to said base and fitting between a pair of said pins.

15. The probe assembly in accordance with claim 14 wherein said guide finger comprises resilient material.

16. The probe assembly in accordance with claim 1 further comprising a spring contact attached to said base and contacting one of said pins when said solder bonds said pin to its corresponding probe contact.

17. A probe assembly for providing signal paths between pins of an integrated circuit (IC) package and external equipment, the probe assembly comprising:
    a base comprising a circuit board, an insulating layer, and a heating element residing between said circuit board and said insulating layer;
    a plurality of probe contacts mounted on said insulating layer, each probe contact corresponding to a separate one of said pins, each probe contact being positioned to contact its corresponding pin when said probe assembly is placed over said pins; and
    solder attached to each of said probe contacts, wherein said heating element delivers heat to said solder via said insulating layer and said contacts, said heat melting said solder.

18. The probe assembly in accordance with claim 17 wherein said base further comprises a plurality of conductors, each conductor extending through said insulating layer, said heating element and said circuit board from a separate one of said probe contacts.

19. The probe assembly in accordance with claim 18 further comprising:
    a cable, and
    means mounted on said base for conveying signals between said cable and said conductors.

20. The probe assembly in accordance with claim 17 further comprising a spring contact attached to said base and contacting one of said pins when said solder bonds said probe contacts to their corresponding pins.

21. A probe assembly for providing signal paths between test equipment and pins extending from a body of an integrated circuit (IC) package, the probe assembly comprising:
    a base comprising an upper insulating layer, a lower insulating layer having a first aperture sized to receive the IC package body, and a heating element having a second aperture sized to receive the IC body, said heating element residing between said upper and lower insulating layers for producing heat in response to an input voltage pulse;
    a plurality of probe contacts mounted on said lower insulating layer, said lower insulating layer electrically insulating said contacts from said heating element, each probe contact corresponding to a separate one of said pins, each probe contact being positioned to contact its corresponding pin when said base is placed over said pins with said IC body extending into said first and second apertures; and
    solder attached to each of said probe contacts, wherein said heat melts said solder.

22. The probe assembly in accordance with claim 21 wherein said heating element generates said heat in response to a voltage pulse applied thereto, and
    means for applying said voltage pulse to said heating element.

23. The probe assembly in accordance with claim 21 wherein said base further comprises a plurality of conductors, each conductor extending through said lower insulating layer, said heating element and said upper insulating layer from a separate one of said probe contacts.

24. The probe assembly in accordance with claim 23 further comprising:
   a cable, and
   means mounted on said base for conveying signals between said cable and said conductors.

25. The probe assembly in accordance with claim 21 further comprising a spring contact attached to said base and contacting one of said pins when said solder bonds said probe contacts to their corresponding pins.

26. The probe assembly in accordance with claim 21 further comprising an integrated circuit device mounted on said base and linked to said probe contacts for receiving signals therefrom.

* * * * *